(12) United States Patent
Lee et al.

(10) Patent No.: US 6,902,834 B2
(45) Date of Patent: Jun. 7, 2005

(54) ORGANIC ELECTROLUMINESCENCE DEVICE

(75) Inventors: Il Han Lee, Kyungesngnam-do (KR); Tae Gon Kim, Seoul (KR)

(73) Assignee: Samsung Oled Co., Ltd., Ulsan-si (KR)

( * ) Notice: Subject to any disclaimer, the term of this patent is extended or adjusted under 35 U.S.C. 154(b) by 0 days.

(21) Appl. No.: 10/691,627

(22) Filed: Oct. 24, 2003

(65) Prior Publication Data

US 2004/0219389 A1 Nov. 4, 2004

(30) Foreign Application Priority Data

Oct. 28, 2002 (KR) .................................. 10-2002-0065836

(51) Int. Cl.⁷ ................................................. H05B 33/12
(52) U.S. Cl. ........................ 428/690; 428/917; 428/332; 313/504; 313/506
(58) Field of Search ................................. 428/332, 690, 428/917; 313/504, 506

(56) References Cited

U.S. PATENT DOCUMENTS

| | | | |
|---|---|---|---|
| 4,885,211 A | 12/1989 | Tang et al. | |
| 5,047,687 A | 9/1991 | VanSlyke | |
| 5,059,862 A | 10/1991 | VanSlyke et al. | |
| 5,739,635 A | 4/1998 | Wakimoto | |
| 5,776,622 A | 7/1998 | Hung et al. | |
| 5,776,623 A | 7/1998 | Hung et al. | |
| 5,937,272 A | 8/1999 | Tang | |
| 6,281,627 B1 * | 8/2001 | Arai et al. | 313/506 |
| 6,589,674 B2 * | 7/2003 | Li et al. | 428/690 |
| 6,635,365 B2 * | 10/2003 | Kawamura et al. | 428/690 |
| 2003/0003614 A1 * | 1/2003 | Andriessen | 438/22 |

OTHER PUBLICATIONS

G.E. Jabbour et al; Aluminum Based Cathode Structure for Enhanced Electron Injection in Electroluminescent Organic Devices; *Applied Physics Letters*; Aug. 31, 1998; vol. 73; No. 9; pp. 1185–1187.

* cited by examiner

Primary Examiner—Dawn Garrett
(74) Attorney, Agent, or Firm—Stein, McEwen & Bui, LLP

(57) ABSTRACT

An organic electroluminescent (EL) display device includes an anode, a hole transport layer formed on the anode, a light-emitting layer formed on the hole transport layer, a cathode formed on the light-emitting layer, and an electron injection layer including a metal oxide represented by formula 1 formed between the light-emitting layer and the cathode. Formula 1 is $MA_xMB_yO_z$, where MA denotes an alkali metal or alkali earth metal, MB is a group IV or V metal, x is a number between 1 and 2 inclusive, y is a number between 1 and 2, and z is a number between 2 and 3 inclusive.

18 Claims, 2 Drawing Sheets

ORGANIC ELECTROLUMINESCENCE DEVICE

CROSS-REFERENCE TO RELATED APPLICATION

This application claims the benefit of Korean Patent Application No. 2002-65836 filed on Oct. 28, 2002, in the Korean Industrial Property Office, the disclosure of which is incorporated herein by reference.

BACKGROUND OF THE INVENTION

1. Field of the Invention

The present invention relates to an organic electroluminescence (EL) display device, and more particularly, to an organic EL display device having improved efficiency of injecting charges from a cathode to an organic layer.

2. Description of the Related Art

An organic EL display device includes an anode formed on a substrate, a hole transport layer, a light-emitting layer, an electron transport layer and a cathode, which are sequentially stacked on the anode. The hole transport layer, the light-emitting layer and the electron transport layer are organic layers formed from organic compounds.

The organic EL display device having the above-described configuration is driven according to the following description.

When a drive voltage is applied to the anode and the cathode, holes from the anode migrate to the light-emitting layer via the hole transport layer and electrons from the cathode migrate to the light-emitting layer via the electron transport layer. The hole transport layer or the electron transport layer itself may be a light-emitting layer. The electrons and holes are recombined at the interface between the hole transport layer and the emitter layer (or the electron transport layer) to generate excitons. As the excitons are deactivated to a ground state, fluorescent molecules of the light-emitting layer emit light, thereby forming an image.

In the organic EL device, in order to lower a drive voltage of the device and to improve charge balance between electrons and holes, it is necessary to increase the efficiency of injecting electrons from the cathode to an organic layer, such as the electron transport layer.

Methods for improving electron injection include using alkali metals having a low work function metal. Examples of such low work function metals include lithium (Li) or magnesium (Mg), co-evaporating Al-alkali metals, or using Al- or Ag-alkali metal alloys, as disclosed in U.S. Pat. Nos. 5,429,884, 5,059,862, 5,047,687, 4,885,211 and so on.

However, the use of a low work function metal is disadvantageous in view of processing manageability and device stability because low work function metals are not stable and are highly reactive. The use of co-evaporation makes it difficult to substantially control the proportion of alloy forming materials. Also, the use of the alloys decreases reproducibility.

Another method for improving electron injection includes forming an electron injection layer including an inorganic compound such as LiF, CsF, SrO or $Li_2O$ between a cathode and an organic layer to a thickness of 5–20 nm, as disclosed in U.S. Pat. Nos. 5,776,622, 5,776,623, 5,937,272 and 5,739,635, and Appl. Phys Lett. 73(1998) 1185).

However, according to the referenced methods, an inorganic material must be processed at a high temperature in forming an electron injection layer, and it is quite difficult to form a thin film having a uniform thickness of 5–20 Å.

As described above, in the conventional organic EL device, various attempts to improve efficiency of injecting electrons from a cathode have been made. However, the conventional organic EL display device cannot provide a satisfactory processing manageability, a low drive voltage, and high luminous efficiency.

SUMMARY OF THE INVENTION

It is an aspect of the present invention to provide an organic EL display device having improved efficiency of injecting electrons from a cathode to an organic layer, a reduced drive voltage, and improved luminous efficiency and life characteristics.

Additional aspects and advantages of the invention will be set forth in part in the description which follows and, in part, will be obvious from the description, or may be learned by practice of the invention.

According to an aspect of the present invention, an organic EL display device includes an anode, a hole transport layer formed on the anode, a light-emitting layer formed on the hole transport layer and a cathode formed on the light-emitting layer, wherein an electron injection layer including a metal oxide represented by formula 1 is formed between the light-emitting layer and the cathode:

$$MA_xMB_yO_z \qquad 1$$

wherein, MA denotes an alkali metal or alkali earth metal, MB is a group IV or V metal, x is a number between 1 and 2, y is a number between 1 and 2, and z is a number between 2 and 3.

It is still another aspect of the present invention, to provide an organic EL display device that may further comprise a hole injection layer between the anode and the hole transport layer.

It is another aspect of the present invention to provide an organic EL display device that may further comprise an electron transport layer between the light-emitting layer and the electron injection layer.

BRIEF DESCRIPTION OF THE DRAWINGS

These and/or other aspects and advantages of the present invention will become and more readily appreciated from the following description of the embodiments, taken in conjunction with the accompanying drawings of which.

DETAILED DESCRIPTION OF THE EMBODIMENTS

Figure 1:
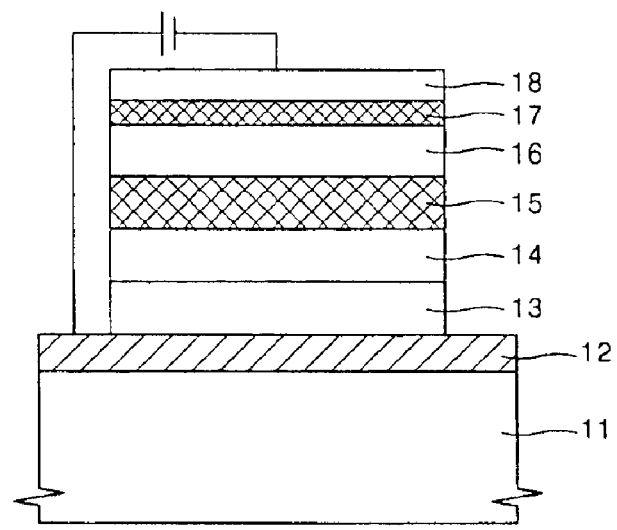
FIG. 1 is a cross-sectional view of an organic EL display device according to an embodiment of the present invention.

Reference will now be made in detail to the embodiments of the present invention, examples of which are illustrated in the accompanying drawings, wherein like reference numerals refer to the like elements throughout. The embodiments are described below in order to explain the present invention by referring to figures and formulas.

In an organic EL display device according to an embodiment of the present invention, an electron injection layer is formed between a cathode and an organic layer (such as a light-emitting layer or an electron transport layer), using a metal oxide represented by formula 1, to reduce an energy gap therebetween:

$$MA_xMB_yO_z \quad\quad 1$$

wherein MA denotes an alkali metal or alkali earth metal, MB is a group IV or V metal, x is a number between 1 and 2, y is a number between 1 and 2, and z is a number between 2 and 3. Examples of MA include Li, Na, K, Rb, Cs, Mg, Ca, Ba and Sr. Examples of MB include Ti, Zr, Hf, V, Nb and Ta. The metal oxide represented by formula 1 is preferably $LiNbO_3$, $LiTaO_3$, $BaTiO_3$ or $KNbO_3$.

FIG. 1 shows a cross-sectional view of an organic EL display device according to an embodiment of the present invention. The organic EL display device includes an anode 12 that is formed on a substrate 11, a hole injection layer 13, a hole transport layer 14, a light-emitting layer 15, an electron transport layer 16, an electron injection layer 17 and a cathode 18 are sequentially stacked on the anode 12. Here, the cathode 18 is perpendicular to the anode 12.

In an organic EL display device, according to another embodiment of the present invention, the electron injection layer 17 may be directly formed on the light-emitting layer 15, as shown in FIG. 1, without forming the electron transport layer 16.

A method of manufacturing the organic EL display device according to the present invention will now be described.

First, the anode 12 is formed on the substrate 11, and the hole injection layer 13 is then selectively formed on the anode 12. Here, the hole injection layer 13 reduces contact resistance between the anode 12 and the hole transport layer 14, and improves the hole transporting capability of the anode 12 with respect to the light-emitting layer 15 (or an electron transport layer 16), thereby improving the overall device characteristics.

Usable materials of the hole injection layer 13 include starburst amine based compounds, for example IDE406 manufactured by IDEMITZ. The thickness of the hole injection layer 13 is from 30 to 100 nm. If the thickness of the hole injection layer 13 is out of the range specified above, hole injection characteristics undesirably deteriorate.

Then, a hole transport layer 14 is formed on the hole injection layer 13. Examples of the hole transporting material for forming the hole transport layer 14 include N,N'-di(naphthalene-1-yl)-N,N'-diphenyl-benzidine (α-NPB) and N,N'-bis(3-methylphenyl)-N,N'-diphenyl-(1,1'-biphenyl)-4,4'-diamine (TPD). The thickness of the hole transport layer is from 10 to 50 nm. If the thickness of the hole transport layer 14 is out of the range specified above, hole injection characteristics undesirably deteriorate.

In addition to the hole transporting material, a dopant capable of emitting light at electron-hole bonds may be added to the hole transport layer 14. Examples of the dopant include 4-(dicyanomethylene)-2-t-butyl-6-(1,1,7,7-tetramethyljulolidyl-9-enyl)-4H-pyran (DCJTB) represented by the following formula, Coumarin 6, Rubrene, DCM, DCJTB, Perylene, Quinacridone and the like, and is used in an amount of 0.1 to 5% by weight per a total amount of the material for forming the hole transport layer.

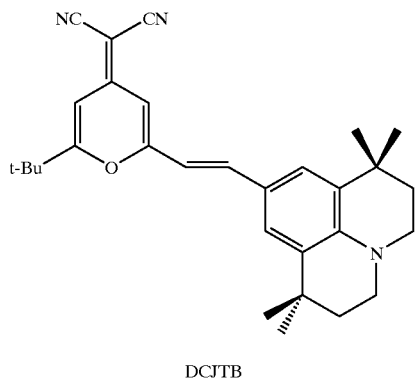

DCJTB

The addition of a dopant in forming the hole transport layer 14 allows emission colors to be adjusted according to the kind and content of a dopant added, improving thermal stability of the hole transport layer 14, thereby improving life characteristics of the device.

Thereafter, the light-emitting layer 15 is formed on the hole transport layer 14. Examples of the material for forming the light-emitting layer 15 include tris(8-quinolinolate)-aluminum ($Alq_3$) and $Almq_3$ represented by the following formulas.

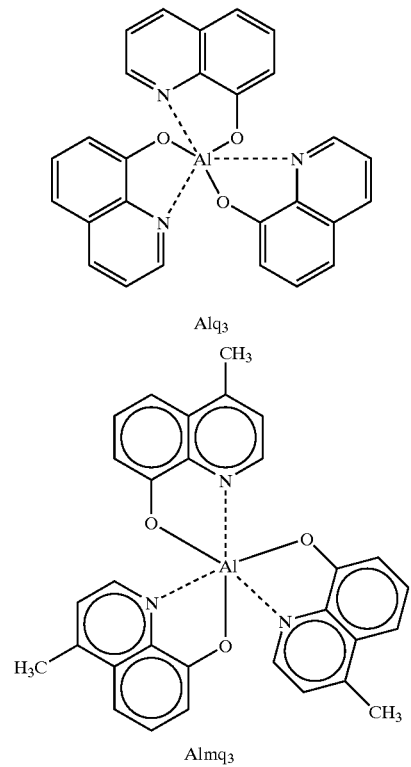

$Alq_3$ $Almq_3$

The thickness of the light-emitting layer 15 is preferably from 30 to 100 nm. If the thickness of the light-emitting layer 15 is out of the range specified above, the efficiency is lowered and a drive voltage is increased.

Optionally, an electron transport layer 16 may be formed on the light-emitting layer 15. Examples of the electron transporting material for forming the electron transport layer 16 include $Alq_3$, and a dopant capable of emitting light at electron-hole bonds may be further added. In this case, the kind and content of the dopant are substantially the same as those of the hole transport layer.

The thickness of the electron transport layer 16 is preferably from 30 to 100 nm. If the thickness of the electron transport layer is out of the range specified above, the efficiency is lowered and the drive voltage is increased. However, it is understood that other thicknesses may be used.

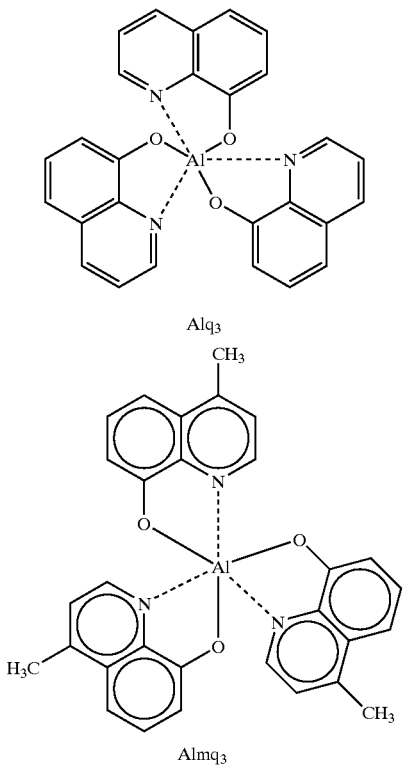

Alq₃

Almq₃

A metal oxide represented by formula 1 is then deposited on the light-emitting layer 15 or the electron transport layer 16, thereby forming an electron injection layer 17. The thickness of the electron injection layer 17 is preferably from 5 to 20 Å. If the thickness of the electron injection layer 17 is less than 5 nm, the electron injection layer forming effects are trivial, and if the thickness of the electron injection layer 17 is greater than 20 nm, effects of efficiency improvement and drive voltage reduction are trivial. However, it is understood that other thicknesses could be used.

Next, a metal for forming a cathode is deposited on the electron injection layer 17, thereby forming a cathode 18. Here, deposition methods are not specially limited and thermal evaporation is used in the present invention. The metal for forming the cathode 18, is a low work function metal such as Li, Ca, LiF/Ca, LiF/Al, Al, Mg or Mg alloy. The cathode 18 is formed by evaporating the low work function metal. The thickness of the cathode 18 is preferably from 5 to 30 nm. If the thickness of the cathode 18 is less than 5 nm, electron injection is not achieved at a low voltage. If the thickness of the cathode 18 is greater than 30 nm, transmittance is noticeably reduced. However, it is understood that other thicknesses could be used.

The organic EL display device according to an aspect of the present invention is manufactured in the above-described sequence of anode/hole transport layer/light-emitting layer/electron transport layer/cathode, or in the reversed sequence of cathode/electron transport layer/light-emitting layer/hole transport layer/anode.

In the organic EL display device according to an aspect of the present invention, a substrate 11 preferably is a glass or transparent plastic substrate having good transparency, surface smoothness, manageability and water resistance. However, other substrate materials can be used.

Examples of the material for forming the anode 12 include transparent, highly conductive materials such as ITO, $SnO_2$ and ZnO. The thickness of the anode 12 is from 100 to 200 nm. If the thickness of the anode 12 is out of the range specified above, driving deterioration due to sheet resistance, a change in optical properties and other undesirable results occur. However, it is understood that other thicknesses could be used.

EXAMPLES

The present invention will now be described in more detail with reference to the following examples. However, it is understood that the invention is not limited to these examples.

Example 1

An ITO electrode having a thickness of 15 nm was formed on a glass substrate, and IDE 406 (manufactured by IDEMITSU) was vacuum deposited thereon, thereby forming a hole injection layer to a thickness of 50 nm. Subsequently, α-NPB was vacuum deposited on the hole injection layer and a hole transport layer a thickness of 15 nm was formed.

Thereafter, Alq₃ was vacuum deposited on the hole transport layer, thereby forming a light-emitting layer having a thickness of 70 nm. $LiNbO_3$ was vacuum deposited on the light-emitting layer and an electron injection layer was formed to a thickness of 0.5 nm (5 Å). Subsequently, aluminum (Al) was vacuum deposited on the electron injection layer and a cathode having a thickness of 150 nm was formed.

Thereafter, the resultant product was sealed, thereby completing the formation of an organic EL display device.

Example 2

An organic EL display device was formed in the same manner as in Example 1 except that the thickness of the electron injection layer was changed from 0.5 nm to 1 nm (10 Å).

Comparative Example 1

An organic EL display device was formed in the same manner as in Example 2 except that the electron injection layer was formed by vacuum depositing LiF instead of $LiNbO_3$.

Figure 2:
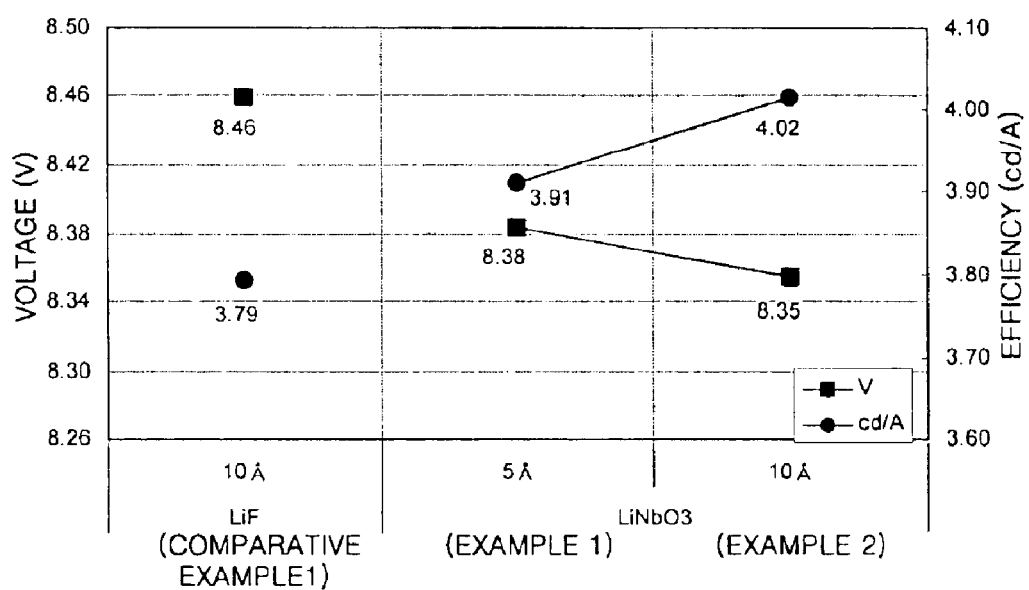
FIG. 2 is a graph illustrating the drive voltage v. efficiency, depending on the thickness of an electron injection layer in organic EL display devices of Examples 1 and 2 and Comparative Example 1.
Figure 3:
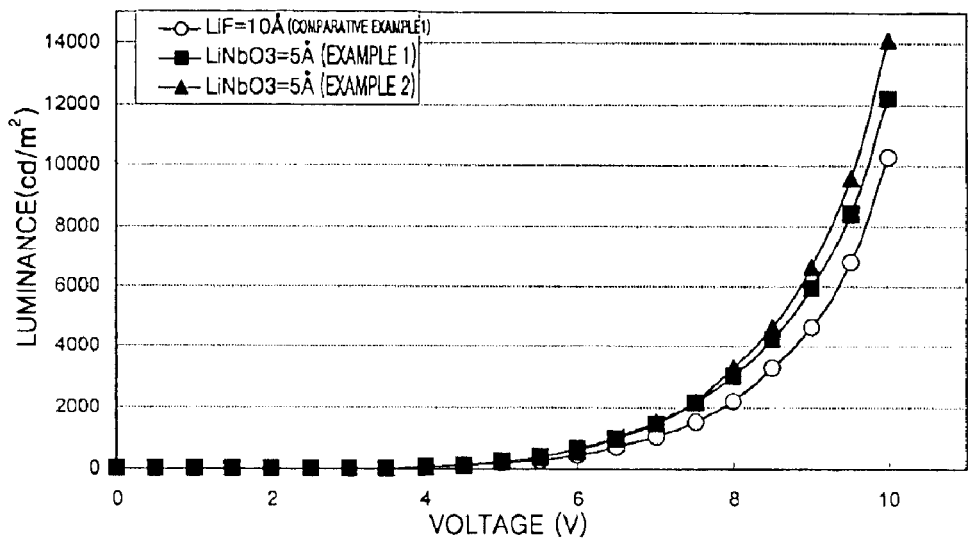
FIG. 3 is a graph illustrating a change in the luminance with respect to the voltage in organic EL display devices of Examples 1 and 2 and Comparative Example 1.
Figure 4:
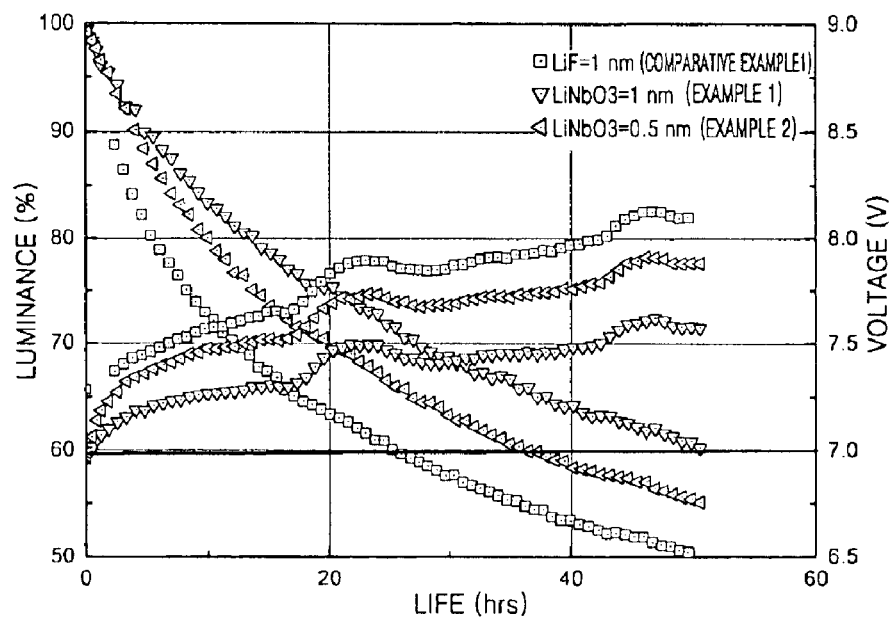
FIG. 4 is a graph illustrating changes in the life and voltage characteristics in organic EL display devices of Examples 1 and 2 and Comparative Example 1.

In the organic EL display devices manufactured in Examples 1–2 and Comparative Example 1, the drive voltage, maximum luminance, luminous and life efficiency characteristics were examined and compiled to illustrate the results as shown in FIGS. 2 through 4.

Among the organic EL display device characteristics, the drive voltage, maximum luminance and luminous efficiencies were evaluated with current density of 100 mA/cm², and the life characteristic was evaluated with current density of 50 mA/cm².

FIG. 2 illustrates the drive voltage versus luminous efficiency, depending on the thickness of an electron injection layer in organic EL display devices of Examples 1 and 2 and Comparative Example 1.

FIG. 2 illustrates the organic EL display devices of Examples 1 and 2 having a reduced drive voltage and improved efficiency compared to the organic EL display device of Comparative Example 1.

FIG. 3 illustrates a change in the luminance with respect to the voltage in organic EL display devices of Examples 1 and 2 and Comparative Example 1.

FIG. 3 illustrates the organic EL display devices of Examples 1 and 2 having improved luminance characteristics compared to the organic EL display device of Comparative Example 1.

FIG. 4 illustrates changes in the life and voltage characteristics in organic EL display devices of Examples 1 and 2 and Comparative Example 1.

FIG. 4 illustrates the organic EL display devices of Examples 1 and 2 having improved life characteristics and reduced rate of increase in voltage, compared to the organic EL display device of Comparative Example 1.

According to the present invention, the efficiency of injecting electrons from a cathode into an organic layer (e.g., a light-emitting layer or electron transport layer), by reducing an energy gap between a cathode and an organic layer cathode can be improved, thereby an organic EL display device having a low drive voltage and improved luminous efficiency, luminance and life characteristics.

While the present invention has been particularly shown and described with reference to embodiments thereof, it will be understood by those of ordinary skill in the art that various changes in form and details may be made therein without departing from the spirit and scope of the present invention as defined by the following claims and equivalents thereof.

What is claimed is:

1. An organic electroluminescent (EL) display device comprising:
    an anode;
    a hole transport layer formed on the anode;
    a light-emitting layer formed on the hole transport layer;
    a cathode formed on the light-emitting layer; and
    an electron injection layer including a metal oxide represented by formula 1 formed between the light-emitting layer and the cathode,
    wherein:
        formula 1 is $MA_xMB_yO_z$,
        MA is an alkali metal or alkali earth metal,
        MB is a group IV or V metal,
        x is a number at or between 1 and 2,
        y is a number at or between 1 and 2, and
        z is a number at or between 2 and 3.

2. The organic EL display device of claim 1, wherein the metal oxide represented by formula 1 is $LiNbO_3$, $LiTaO_3$, $BaTiO_3$ or $KNbO_3$.

3. The organic EL display device of claim 1, wherein the electron injection layer has a thickness at or between 5 and 20 Å.

4. The organic EL display device of claim 1, further comprising a hole injection layer between the anode and the hole transport layer.

5. The organic EL display device of claim 1, further comprising an electron transport layer between the light-emitting layer and the electron injection layer.

6. The organic EL display device of claim 1, wherein the MA of the metal oxide represented in formula 1 is selected from the group consisting of Li, Na, K, Rb, Cs, Mg, Ca, Ba, and Sr.

7. The organic EL display device of claim 1, wherein the MB of the metal oxide represented in formula 1 is from the group consisting of Ti, Zr, Hf, V, Nb, and Ta.

8. The organic EL display device of claim 1, wherein the metal oxide represented by formula us $LiNbO_3$.

9. The organic EL display device of claim 1, wherein the metal oxide represented by formula 1 is $LiTaO_3$.

10. The organic EL display device of claim 1, wherein the metal oxide represented by formula 1 is $BaTiO_3$.

11. The organic EL display device of claim 1, wherein the metal oxide represented by formula 1 is $KNbO_3$.

12. The organic EL display device of claim 1, wherein the hole transport layer further comprises a dopant capable of emitting light so as to allow emission colors to be adjusted according to the kind and content of the dopant.

13. The organic EL display device of claim 12, wherein the dopant is selected from the group consisting of 4-(dicyanomethylene)-2-t-butyl-6-(1,1,7,7-tetramethyljulolidyl-9-enyl)-4H-pyran, Coumarin 6, Rubrene, DCM, DCJTB, Perylene, and Quinacridone.

14. The organic EL display device of claim 12, wherein the dopant is in an amount of 0.1 to 5% by weight of the hole transport layer.

15. The organic EL display device of claim 5, wherein the electron transport layer has a thickness of 30 nm to 100 nm.

16. The organic EL display device of claim 5, wherein the electron transport layer includes $Alq_3$.

17. The organic EL display device of claim 5, wherein the electron transport layer further includes a dopant capable of emitting light.

18. The organic EL display crevice of claim 17, wherein the dopant is selected from a group consisting of 4-(dicyanomethylene)-2-t-butyl-6-(1,1,7,7-tetramethyljulolidyl-9-enyl)-4H-pyran, Coumarin 6, Rubrene, DCM, DCJTB, Perylene, and Quinacridone.

* * * * *

UNITED STATES PATENT AND TRADEMARK OFFICE
CERTIFICATE OF CORRECTION

PATENT NO. : 6,902,834 B2
DATED : June 7, 2005
INVENTOR(S) : Il Han Lee et al.

It is certified that error appears in the above-identified patent and that said Letters Patent is hereby corrected as shown below:

<u>Title page,</u>
Item [73], Assignee, change "Samsung Oled Co., Ltd." to -- SAMSUNG OLED CO., LTD. --.

<u>Column 8,</u>
Line 21, change "formula us" to -- formula 1 is --.
Line 47, change "crevice" to -- device --.

Signed and Sealed this

Second Day of August, 2005

JON W. DUDAS
*Director of the United States Patent and Trademark Office*